United States Patent [19]

Skarivoda

[11] Patent Number: 5,618,129
[45] Date of Patent: Apr. 8, 1997

[54] SNAP-ENGAGING MOUNTING PLATE

[75] Inventor: Edwin L. Skarivoda, Manitowoc, Wis.

[73] Assignee: Paragon Electric Company, Inc., Two Rivers, Wis.

[21] Appl. No.: 402,910

[22] Filed: Mar. 13, 1995

[51] Int. Cl.⁶ .................................................. H05K 5/02
[52] U.S. Cl. ................. 403/389; 174/138 G; 361/759; 403/405.1; 403/407.1; 439/75
[58] Field of Search ........................ 24/297, 453, 697.1; 174/138 E, 138 G, 166 S; 248/222.12; 361/735, 740, 742, 744, 747, 758, 759, 770, 801, 807, 809; 403/389, 405.1, 407.1; 439/74, 75; D8/363; D13/182

[56] References Cited

U.S. PATENT DOCUMENTS

| | | | |
|---|---|---|---|
| D. 295,369 | 4/1988 | Niwa | 24/453 X |
| 2,937,834 | 5/1960 | Orenick et al. | 248/71 |
| 3,568,001 | 3/1971 | Straus | 439/75 X |
| 3,688,635 | 9/1972 | Fegen | 361/809 X |
| 3,880,486 | 4/1975 | Avakian | 439/75 |
| 4,193,659 | 3/1980 | Deverrewaere | 439/56 |
| 4,693,009 | 9/1987 | Bone | 30/392 |
| 4,811,922 | 3/1989 | Yoneyama | 248/73 |
| 4,841,100 | 6/1989 | Ignasiak | 174/138 G |
| 4,872,089 | 10/1989 | Ocken et al. | 361/710 |
| 4,883,382 | 11/1989 | Mushya | 24/297 X |
| 4,938,703 | 7/1990 | Nakano | 439/74 |
| 4,951,176 | 8/1990 | Bergfried et al. | 361/760 |
| 4,953,061 | 8/1990 | Nitkiewicz | 361/807 |
| 4,987,517 | 1/1991 | Kurz | 361/683 |
| 5,018,982 | 5/1991 | Speraw et al. | 439/74 |
| 5,035,641 | 7/1991 | Van-Santbrink et al. | 439/329 |
| 5,045,976 | 9/1991 | Guilleminot | 361/807 |
| 5,199,896 | 4/1993 | Mosquera | 439/329 |
| 5,223,674 | 6/1993 | Reznikov | 361/759 X |
| 5,365,408 | 11/1994 | Apitz | 361/807 |
| 5,488,539 | 1/1996 | Testa et al. | 361/807 X |
| 5,507,585 | 4/1996 | Diederich et al. | 403/349 |

FOREIGN PATENT DOCUMENTS

| | | | |
|---|---|---|---|
| 33850 | 1/1981 | European Pat. Off. | 174/166 S |
| 2359042 | 5/1975 | Germany | 361/809 |
| 6-260245 | 9/1994 | Japan | 439/74 |

OTHER PUBLICATIONS

Research Disclosure, Jan. 1993, No. 345, Kenneth Mason Publications Ltd England, #34590—Snap and Turn Retainer for Book Package Cover and Card Control Jan. 1993.

*Primary Examiner*—Blair Johnson
*Assistant Examiner*—Andrea Chop
*Attorney, Agent, or Firm*—Foley & Lardner

[57] ABSTRACT

An apparatus configured to facilitate mounting a first device to a second device where the first device has a plurality of first apertures and the second device has a plurality of second apertures. The apparatus includes a base member and a plurality of post members affixed to the base member at a plurality of attachment loci. Each post member is substantially in register with a first aperture and with a second aperture when the first device, the second device, and the apparatus are in a mounting orientation. Each post member includes a tab member and a mounting aperture which traverses the post member. For each post member and for each first aperture, the tab member is configured to flex from an initial position to pass through the first aperture when the post member is urged into the first aperture. The tab member returns to the initial position when the post member passes a predetermined distance into the first aperture to captively retain the first device intermediate the tab member and the base member. Each first aperture is substantially coaxial with one of the second apertures and substantially coaxial with one of the mounting apertures when in the mounting orientation.

12 Claims, 3 Drawing Sheets

SNAP-ENGAGING MOUNTING PLATE

BACKGROUND OF THE INVENTION

The present invention is generally related to an apparatus for mounting a subunit to a host unit in assembling a device. More particularly, the present invention relates to a mounting apparatus to facilitate mounting a first device to a second device. The mounting apparatus snap-engages one of the devices and provides mounting apertures for through-fastener mounting of the first device to the second device with the snap-engaged mounting apparatus intermediate the first device and the second device.

Snap-engaging structures are found in various environments. For example, U.S. Pat. No. 4,841,100, of Jun. 20, 1989, to Ignasiak for "Expanding Surface Mount Compatible Retainer Post", discloses an expandable retainer post for use with printed circuit boards employing surface mount technology intended to be attached to a host board. The Ignasiak device, however, does not provide a mounting aperture through his snap-engaging structure to facilitate mounting with a through-hole fastener.

U.S. Pat. No. 5,365,408, of Nov. 15, 1994, to Apitz for "Chassis with a Movable Attachment Element Affixed Thereto", discloses a chassis with attachment elements which cannot be separated from the chassis, with an attaching device for carrying and attaching components or chassis elements. In one embodiment, Apitz discloses a column-shaped attachment element for attaching a plate-shaped component using a hot-molded retaining head. If the retaining head must be removed during servicing, or if it breaks off, a self-tapping screw may be screwed into a central bore in the column-shaped attachment element as a repair element to affix the subchassis to the original chassis in the same manner as the original retaining head. However, Apitz does not disclose employment of a snap-engaging apparatus with a through-aperture to facilitate mounting a subassembly to a host assembly.

Another known method of attaching a printed circuit board to a host device is to heat stake a mounting plate to the printed circuit board to provide the requisite stand-off spacing between the printed circuit board and the host device.

There is a need for an inexpensive and reliable apparatus to facilitate mounting a first device, such as a printed circuit board, to a second device in a manner facilitating mounting by a through-hole fastener. It is particularly desirable that such a mounting apparatus be configured to provide a predetermined stand-off distance between the first device and the host device.

SUMMARY OF THE INVENTION

The present invention is an apparatus configured to facilitate mounting a first device to a second device where the first device has a plurality of first apertures traversing the first device at a plurality of first loci. The second device has a plurality of second apertures at a plurality of second loci. Each respective second aperture is proportioned to engage a fastener. The apparatus comprises a base member and a plurality of post members affixed to the base member at a plurality of attachment loci. Each respective post member is configured to be substantially in register with one respective first aperture and substantially in register with one respective second aperture when the first device, the second device, and the apparatus are in a mounting orientation. Each respective post member includes a tab member and a mounting aperture, which mounting aperture traverses the post member.

For each respective post member and for each respective first aperture, the tab member is configured to flex appropriately from an initial position to pass through the first aperture when the post member is urged into the first aperture. The tab member is configured to return to the initial position when the post member passes a predetermined distance into the first aperture to captively retain the first device intermediate the tab member and the base member. Each first aperture is substantially coaxial with one of the second apertures and substantially coaxial with one of the mounting apertures when in the mounting orientation.

It is, therefore, an object of the present invention to provide an apparatus configured to facilitate mounting a first device to a second device which provides an easy and reliable connection between the apparatus and the first device.

It is a further object of the present invention to provide an apparatus configured to facilitate mounting a first device to a second device which facilitates effecting such mounting by through-hole mounting.

Yet a further object of the present invention is to provide an apparatus configured to facilitate mounting a first device to a second device which establishes a predetermined stand-off distance intermediate the first device and the second device when in a mounted orientation.

Further advantages and features of the present invention will be apparent from the following specification and claims when considered in connection with the accompanying drawings illustrating in the preferred embodiment of the invention.

DETAILED DESCRIPTION OF THE PREFERRED EMBODIMENT

Figure 1:
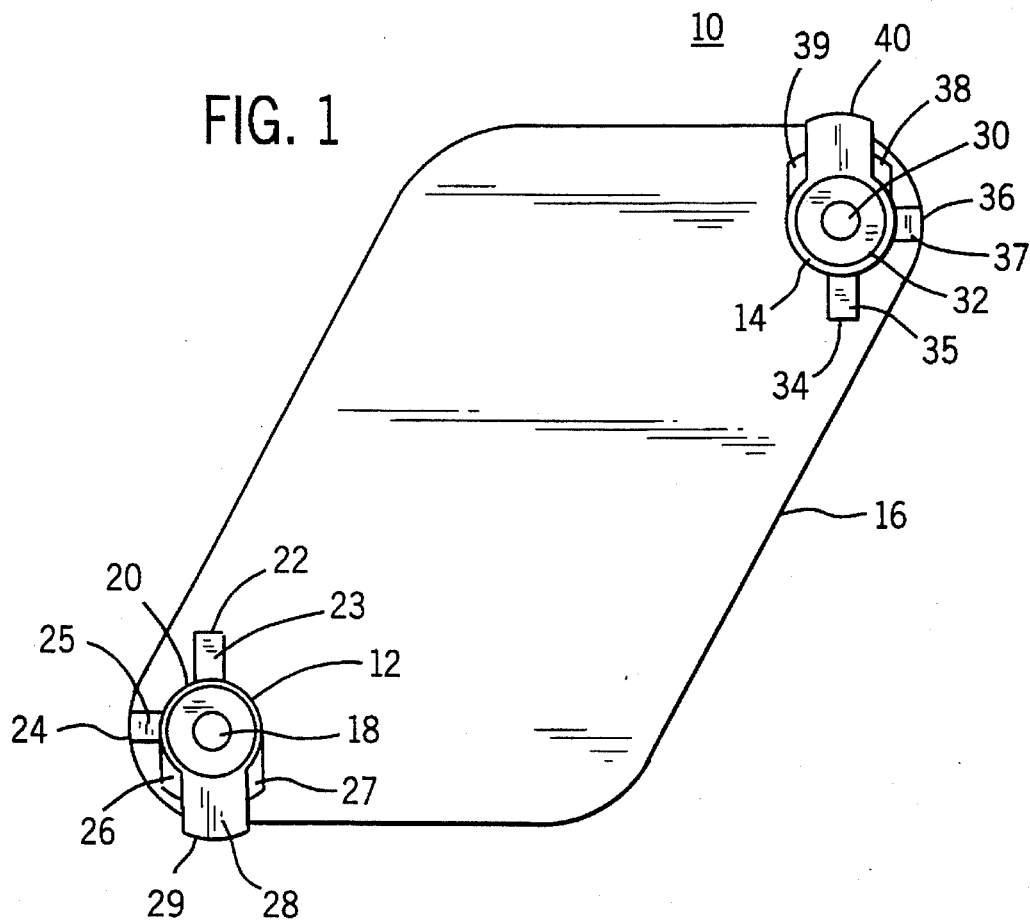
FIG. 1 is a plan view of the preferred embodiment of the present invention.

FIG. 1 is a plan view of the preferred embodiment of the present invention. In FIG. 1, an apparatus 10 is illustrated having a pair of posts 12, 14 depending from a base member 16. Preferably, posts 12, 14 are integrally formed with base member 16 and depend substantially perpendicular from base member 16 in the same direction from base member 16. Base member 16 is preferably a substantially planar member. Post 12 has a central aperture 18 surrounded by a wall 20. A buttress 22 and a buttress 24 are preferably integrally formed with post 12, depend from wall 20, and terminate at a position below the upper limits of wall 20 (as shall be illustrated in subsequent drawings). The respective upper limits 23, 25 of buttresses 22, 24 are substantially coplanar in a plane generally parallel with base member 16. A shelf 26 is also integrally formed with post 12 and terminates in an upper limit 27 which is substantially coplanar with upper limits 23, 25 of buttresses 22, 24.

A generally wedge-shaped tab 28 is further integrally formed with post 12 and depends from wall 20. A lower limit 29 of tab 28 (to be illustrated in greater detail in subsequent drawings) terminates in a plane substantially parallel with base member 16 and displaced a predetermined distance above the plane which contains upper limits 23, 25 of buttresses 22, 24 and upper limit 27 of shelf 26.

Post 14 is similarly configured with a central aperture 30 surrounded by a wall 32. Buttresses 34, 36 and a shelf 38 are integrally formed with post 14. Buttresses 34, 36 terminate at upper limits 35, 37 and shelf 38 terminates at an upper limit 39. Upper limits 35, 37, 39 lie substantially in a plane generally parallel with base member 16. Further, upper limits 35, 37, 39 are substantially coplanar with upper limits 23, 25, 27 of buttresses 22, 24 and shelf 26. A generally wedge-shaped tab 40 is also integrally formed with post 14 and terminates in a generally planar lower limit 41 (to be illustrated in greater detail in subsequent drawings). Lower limit 41 lies substantially in a plane displaced above the plane containing upper limits 23, 25, 35, 37 of buttresses 22, 24, 34, 36 and upper limits 27, 39 of shelves 26, 38. Further, lower limit 41 of tab 40 is generally coplanar with lower limit 29 of tab 28.

In order to facilitate understanding the present invention, like elements will be indicated using like reference numerals in the various drawings.

Figure 2:
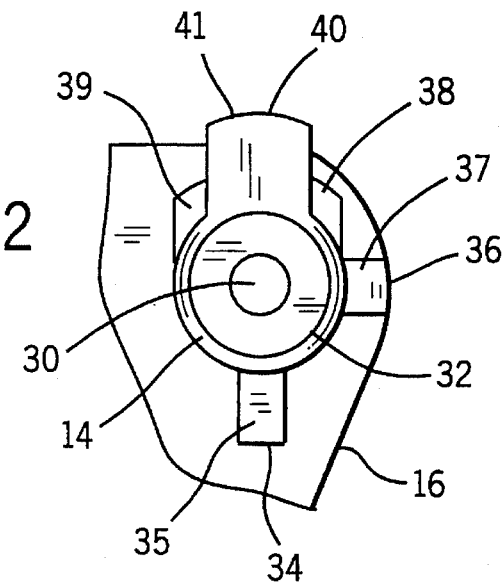
FIG. 2 is a plan view of details of a selected post member of the apparatus illustrated in FIG. 1.

FIG. 2 is a plan view of details of a selected post member of the apparatus illustrated in FIG. 1. In FIG. 2, post 14 is illustrated as depending from substantially planar base member 16. Buttresses 34, 36 and shelf 38 are integrally formed with post 14. Post 14 has a central aperture 30 surrounded by a wall 32. A tab 40 is also integrally formed with post 14. Buttresses 34, 36 terminate in upper limits 35, 37. Shelf 38 terminates in upper limit 39, which is substantially coplanar with upper limits 35, 37. Tab 40 terminates in lower limit 41, which is displaced above upper limits 35, 37, 39.

Figure 3:
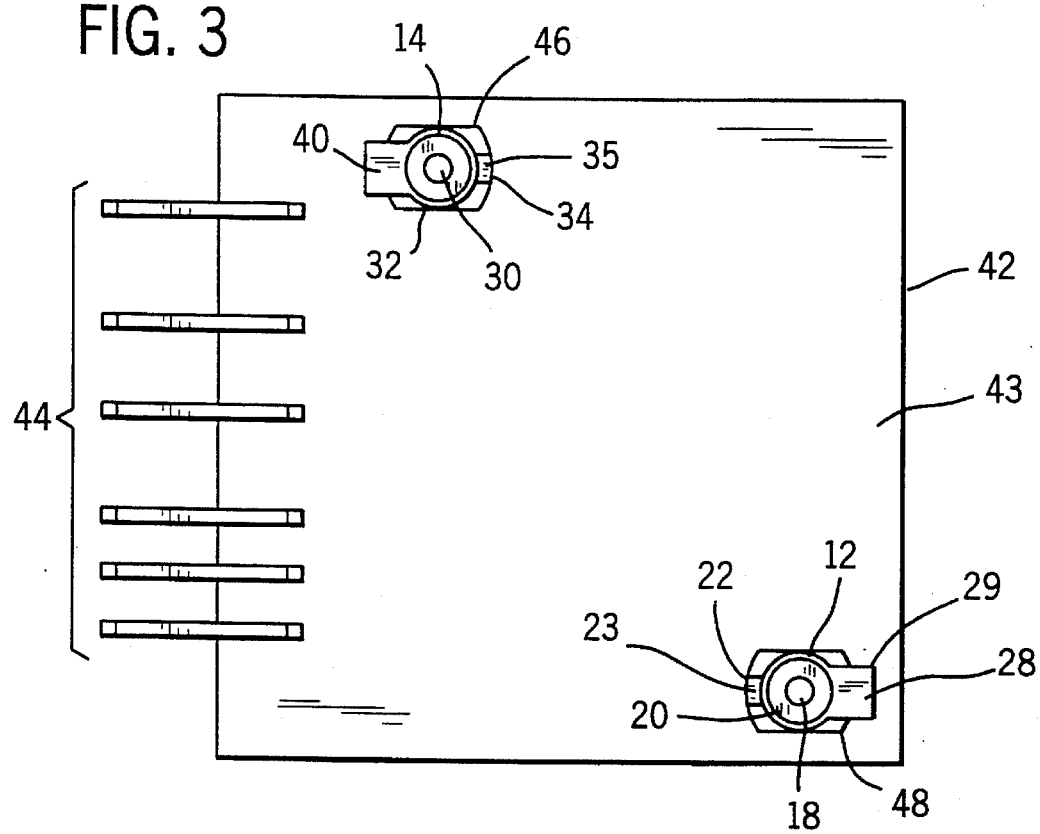
FIG. 3 is a plan view of a printed circuit board with the preferred embodiment of the present invention engaged therewith.

FIG. 3 is a plan view of a printed circuit board with the preferred embodiment of the present invention engaged therewith. In FIG. 3, a printed circuit board 42 is illustrated (details of circuit traces on printed circuit board 42 are omitted for simplicity). Printed circuit board 42 includes a plurality of electrical terminals 44 which are configured for connection to various predetermined loci in the printed circuit borne upon printed circuit board 42 (not shown in detail in FIG. 3).

Printed circuit board 42 is traversed by apertures 46, 48. In the top plan view of FIG. 3, apparatus 10 is hidden below (or behind) printed circuit board 42. Apparatus 10 has been fully inserted into apertures 46, 48, thereby engaging apparatus 10 with printed circuit board 42. That is, post 12 has been inserted through aperture 48 appropriately that tab 28 rests its lower limit 29 on the top side 43 of printed circuit board 42. Upper limit 23 of buttress 22, upper limit 25 of buttress 24 (not visible in FIG. 3), and upper limit 27 of shelf 26 (not visible in FIG. 3) are disposed on the lower side 45 of printed circuit board 42. Printed circuit board 42 is captively retained intermediate lower limit 29 of tab 28 on top side 43 and upper limits 23, 25, 27 of buttresses 22, 24 and shelf 26 on lower side 45. The gap established between the plane containing upper limits 23, 25, 27 of buttresses 22, 24 and shelf 26 and the plane containing lower limit 29 of tab 28 are spaced apart a distance substantially equal to or slightly greater than the thickness of printed circuit board 42 in the vicinity of aperture 48.

Post 14 is similarly disposed within aperture 46 of printed circuit board 42. Post 14 is oriented with lower limit 41 of tab 40 on top side 43 of printed circuit board 42. Upper limits 35, 37, 39 of buttresses 34, 36 (not visible in FIG. 3) and shelf 38 (not visible in FIG. 3) are disposed on lower side 45 of printed circuit board 42. Thus, printed circuit board 42 is captively retained between lower limit 41 of tab 40 and upper limits 35, 37, 39 of buttresses 34, 36 and shelf 38. The plane containing upper limits 35, 37, 39 of buttresses 34, 36 and shelf 38 is displaced from the plane containing lower limit 41 of tab 40 a distance substantially equal to or slightly greater than the thickness of printed circuit board 42 in the vicinity of aperture 46.

Figure 4:
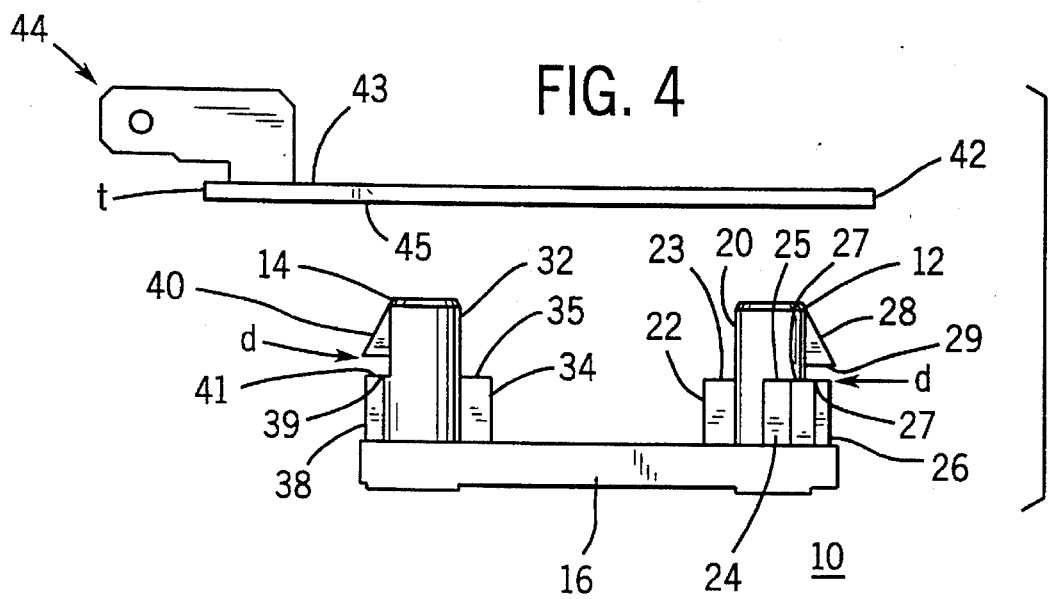
FIG. 4 is a side view of a printed circuit board poised for engagement with the apparatus illustrated in FIG. 1.

FIG. 4 is a side view of a printed circuit board poised for engagement with the apparatus illustrated in FIG. 1. In FIG. 4, printed circuit board 42 is illustrated poised above apparatus 10. Post 12 is generally perpendicular with and integrally formed with base member 16. Post 12 includes wall 20 (which surrounds central aperture 18, not visible in FIG. 4). Integrally formed buttresses 22, 24 depend from wall 20. Shelf 26 is also integrally formed with post 12 and is disposed beneath integrally formed, generally wedged-shaped tab 28. Upper limits 23, 25, 27 of buttresses 22, 24 and shelf 26 are generally coplanar and are displaced a distance "d" from lower limit 29 of wedge-shaped tab 28. Distance "d" is preferably substantially equal to thickness "t" of printed circuit board 42, or slightly larger than thickness "t".

Similarly, post 14 depends generally vertically from base member 16 and is preferably integrally formed with base member 16. Shelf 38 and buttresses 34, 36 (not visible in FIG. 4) are integrally formed with wall 32 of post 14 and depend from wall 32. Upper limits 35, 37, 39 of buttresses 34, 36 and shelf 38 are preferably coplanar with upper limits 23, 25, 27 of buttresses 22, 24 and shelf 26 and are disposed below lower limit 41 of tab 40 a distance "d". Wedge-shaped tab 40 is also preferably integrally formed with post 14 and depends from wall 32.

Figure 5:
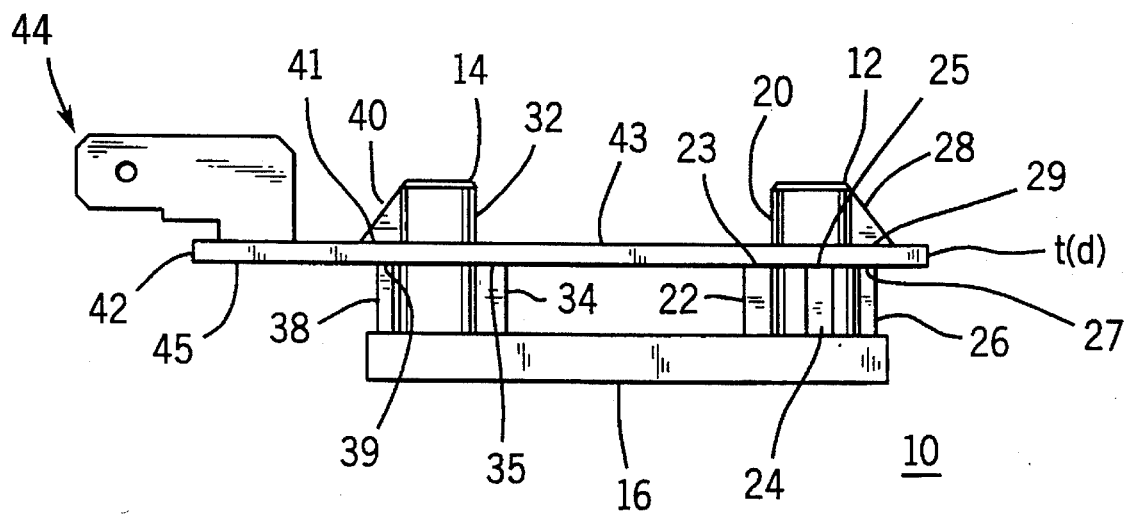
FIG. 5 is a side view of a printed circuit board engaged with the apparatus illustrated in FIG. 1.

FIG. 5 is a side view of a printed circuit board 42 engaged with the apparatus 10 in FIG. 1. In FIG. 5, apparatus 10 is engaged with printed circuit board 42. FIG. 5 is a side view of the assembly 10, 42 illustrated in the plan view of FIG. 3.

To change the orientation of printed circuit board 42 with respect to apparatus 10 from the respective positions illustrated in FIG. 4 to the respective positions illustrated in FIG. 5, a user must urge apparatus 10 and printed circuit board 42 together. Such urging must be appropriate to insert post 14 within aperture 46 (FIG. 3) and to insert post 12 within aperture 48 of printed circuit board 42. By such urging, wedge-shaped tab 40 engages an edge of aperture 46, and wedge-shaped tab 28 engages an edge of aperture 48. Further urging together of printed circuit board 42 and apparatus 10 deflects tab 40 with respect to aperture 46 and deflects tab 28 with respect to aperture 48 appropriately to facilitate passage of post 14 through aperture 46 and passage of post 12 through aperture 48. Once posts 12, 14 are sufficiently urged into their respective apertures 46, 48, tabs 40, 28 return to their initial positions at which they were situated before deflection. In such manner, appropriately aligned urging together of printed circuit board 42 and apparatus 10 changes the relative positions of circuit board 42 and apparatus 10 from the orientation illustrated in FIG. 4 (poised for engagement) to the positions illustrated in FIGS. 3, 5 (engaged).

In actuality, the flexing which facilitates passing of tabs 40, 28 through apertures 46, 48 occurs along the length of each post 12, 14, including flexing in the vicinity of tabs 40, 28. Such full-length flexing is accommodated by the elongated shape of apertures 46, 48, which is most clearly seen in FIG. 3.

When engaged with apparatus 10, printed circuit board 42 is captively retained intermediate lower limit 41 of tab 40 and upper limits 35, 37, 39 of buttresses 34, 36 (buttress 36 is not visible in FIGS. 4, 5) and shelf 38. Further, printed circuit board 42 is also captively retained intermediate lower limit 29 of tab 28 and upper limits 23, 25, 27 of buttresses 22, 24 and shelf 26. As seen most clearly in FIG. 3, in this assembled orientation, apertures 18, 30 provide through-hole access through posts 12, 14 whereby the assembly comprising printed circuit board 42 engaged with apparatus 10 (as illustrated in FIGS. 3, 5) may be mounted to a host device (not shown) using through-hole fasteners through apertures 18, 30 to engage the host device in appropriate mating registered apertures. Such through-hole fastening may be effected by a threaded fastener, a rivet fastener, a force-fit pin fastener, a christmas-tree fastener, or other through-hole fasteners known in the art.

Figure 6:
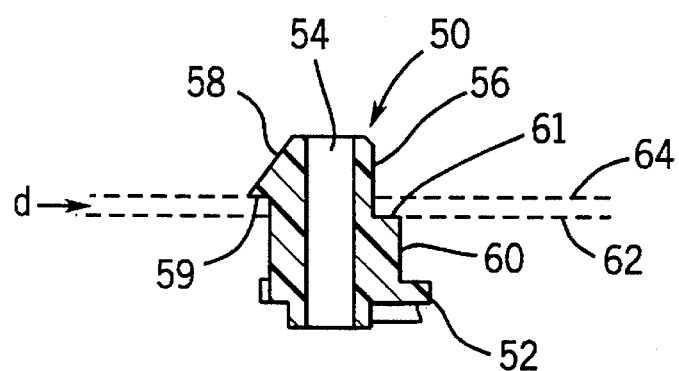
FIG. 6 is a section drawing of an alternate embodiment of a post member for use with the present invention.

FIG. 6 is a section drawing of an alternate embodiment of a post member for use with the present invention. In FIG. 6, a post 50 is integrally formed with a base member 52. An aperture 54 traverses post 50 and is surrounded and defined by a wall 56. Integrally formed with and depending from a first side of wall 56 is a generally wedge-shaped tab 58. Integrally formed with and depending substantially from wall 56 substantially opposite on post 50 from wedge-shaped tab 58 is a buttress 60. Buttress 60 terminates in an upper limit 61. Upper limit 61 lies in a plane 62. Wedge-shaped tab 58 terminates in a lower limit 59. Lower limit 59 lies in a plane 64. Planes 62, 64 are separated by a distance "d" which is preferably substantially equal to or slightly greater than the thickness of a printed circuit board (not shown in FIG. 6) anticipated to be employed with an apparatus employing post 50. The operation of post 50 during installation with respect to a printed circuit board having appropriate apertures therethrough is substantially the same as described above in connection with engagement of apparatus 10 with printed circuit board 42. Post 50 is less complex than posts 12, 14 and presents fewer complications for its manufacture by molding, such as fewer buttresses and no shelf. Post 50 therefore provides a practical alternate embodiment for a post for use with the present invention.

It is to be understood that, while the detailed drawings and the specific examples given describe the preferred embodiments of the invention, they are for the purpose of illustration only, that the apparatus of the invention is not limited to the precise details and conditions disclosed, and that various changes may be made therein without departing from the spirit of the invention which is defined by the following claims.

I claim:

1. An apparatus configured to facilitate mounting a first device to a second device; said first device having a plurality of first apertures traversing said first device at a plurality of first loci; said second device having a plurality of second apertures at a plurality of second loci; each respective second aperture of said plurality of second apertures being proportioned to engage a fastener; the apparatus comprising:

a base member; and a plurality of post members affixed to said base member at a plurality of attachment loci, said plurality of post members and said base member being made from a unitary, one-piece construction; each respective post member of said plurality of post members configured to be substantially in register with one respective first aperture of said plurality of first apertures and substantially in register with one respective second aperture of said plurality of second apertures when said first device, said second device, and the apparatus are in a mounting orientation;

each said respective post member including a respective tab member and a respective mounting aperture, said respective mounting aperture traversing said respective post member; for each said respective post member and for each said respective first aperture, said respective tab member being configured to flex appropriately from an initial position to pass through said respective first aperture when said respective post member is urged into said respective first aperture; said respective tab member configured to return to said initial position when said respective post member passes a predetermined distance into said respective first aperture to captively retain said first device intermediate said respective tab member and said base member.

2. The apparatus configured to facilitate mounting a first device to a second device as recited in claim 1 wherein selected post members of said plurality of post members are adapted to engage said first device appropriately to establish a predetermined standoff distance intermediate said first device and said second device in said mounting orientation.

3. The apparatus configured to facilitate mounting a first device to a second device as recited in claim 1 wherein said respective post members protrude substantially perpendicularly from the same side of said base member.

4. The apparatus configured to facilitate mounting a first device to a second device as recited in claim 3 wherein each mounting aperture is centrally located within said respective post member.

5. The apparatus configured to facilitate mounting a first device to a second device as recited in claim 4 wherein each post member is configured to be urged into said respective first aperture and each post member flexes along the entire length of said respective post member.

6. The apparatus configured to facilitate mounting a first device to a second device as recited in claim 1 wherein each tab member is generally wedge-shaped having a lower limit facing toward said base member.

7. The apparatus configured to facilitate mounting a first device to a second device as recited in claim 6 further comprising a plurality of buttresses integrally formed with each respective post member, each buttress extending from said base member to an upper limit facing away from said base member, each upper limit spaced a fixed distance from said respective lower limit and located a predetermined standoff distance from the base member.

8. The apparatus configured to facilitate mounting a first device to a second device as recited in claim 7 wherein each respective post member is configured to receive said first device between said upper limit and said lower limit in the mounting orientation.

9. The apparatus configured to facilitate mounting a first device to a second device as recited in claim 7 wherein said upper limits lie substantially in a first plane generally parallel with said base member, said lower limits lie substantially in a second plane generally parallel with said base member.

10. An apparatus configured to facilitate mounting a first device to a second device; said first device having at least one first aperture traversing said first device at at least one first locus; said first device having a first thickness neighboring said at least one first locus; said second device having at least one second aperture at at least one second locus; said at least one second aperture being proportioned to engage a fastener; the apparatus comprising:

a base member; and at least one fastening member affixed to said base member at at least one attachment locus, said at least one fastening member and said base member being made from a unitary, one-piece construction; said at least one fastening member including a stop face, a mounting aperture, and a clasping member; said clasping member being flexibly disposed in a position generally adjacent said mounting aperture and displaced from said stop face; said clasping member presenting a facing stop to said stop face, said facing stop being displaced from said stop face; said at least one fastening member configured to be substantially in register with said at least one first aperture and substantially in register with said at least one second aperture when said first device, said second device, and the apparatus are in a mounting orientation; said clasping member configured to be engaged by said at least one first aperture when said at least one fastening member is urged into said at least one first aperture; further said urging of said at least one fastening member displacing said clasping member from a first position to a second position; said second position configured to be appropriate to accommodate passage of said clasping member through said at least one first aperture; said clasping member configured to return to said first position after passing through said at least one first aperture to establish a mounted position; said at least one fastening member configured to retain said first device intermediate said stop face and said facing stop when said clasping member is in said mounted position.

11. An apparatus configured to facilitate mounting a first device to a second device as recited in claim 10 wherein said at least one fastening member has an effective length between said base and said stop face, said length providing a stand off distance intermediate said stop face and said base.

12. An apparatus for mounting a circuit board to a substantially planar host device substantially in parallel with the circuit board, the circuit board and the host device having a plurality of first and second apertures, respectively, with each first aperture aligned coaxially with one second aperture when the circuit board is mounted to the host device, each second aperture being adapted to securely receive a fastener inserted through the respective first aperture, the apparatus comprising:

a substantially planar base member; and a plurality of post members affixed to the base member and extending substantially perpendicularly from a side of the base member, said plurality of post members and said base member being made from a unitary, one-piece construction, each post member including a tab member and a mounting aperture which traverses the post member, each post member located such that each mounting aperture is configured to be substantially in register with one first and one second aperture when the circuit board is mounted to the host device, each tab member configured to flex when the respective post member is passed a predetermined distance into the one first aperture.

* * * * *